US012633730B2

(12) United States Patent
Shirosaka et al.

(10) Patent No.: US 12,633,730 B2
(45) Date of Patent: May 19, 2026

(54) ELECTRICAL JUNCTION BOX AND WIRE HARNESS

(71) Applicant: YAZAKI CORPORATION, Tokyo (JP)

(72) Inventors: Kazuki Shirosaka, Kakegawa (JP); Takanori Kanamori, Kakegawa (JP); Yasuhiro Yamaguchi, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 274 days.

(21) Appl. No.: 18/658,956

(22) Filed: May 8, 2024

(65) Prior Publication Data

US 2024/0388070 A1    Nov. 21, 2024

(30) Foreign Application Priority Data

May 15, 2023    (JP) ................................. 2023-079767

(51) Int. Cl.
*H02G 3/03*          (2006.01)
*B60R 16/02*          (2006.01)
(Continued)

(52) U.S. Cl.
CPC ........... *H02G 3/03* (2013.01); *B60R 16/0207* (2013.01); *B60R 16/0239* (2013.01);
(Continued)

(58) Field of Classification Search
CPC .......... H02G 3/081; H02G 3/08; H02G 3/088; H02G 5/10; H02G 5/08; H02G 3/03; H02G 3/16; B60R 16/0238; B60R 16/0239; B60R 16/02; B60R 16/0207;
B60R 16/0215; B60R 16/03; H01R 2201/26; H01R 13/2414; H01R 13/40; H05K 1/0203; H05K 7/20; H05K 7/2039; H05K 7/20409; H05K 7/20854; H05K 7/203; H05K 7/209;
(Continued)

(56) References Cited

U.S. PATENT DOCUMENTS 6,350,949 B1 *    2/2002    Boyd ................... B60R 16/0238
                                                                174/17.05
10,263,405 B2 *    4/2019    Chin ................... B60R 16/0238
(Continued)

FOREIGN PATENT DOCUMENTS

JP          2013-31278 A          2/2013
JP          2018-38128 A          3/2018

*Primary Examiner* — Michael A Matey
(74) *Attorney, Agent, or Firm* — KENEALY VAIDYA LLP

(57)          ABSTRACT

An electrical junction box includes a heat generating component and a cooling unit that cools the heat generating component. The cooling unit includes: a recess provided at the holding position of the heat generating component in a resin case that holds the heat generating component; packing that is provided along the peripheral edge of the recess, is compressed by the contact with the heat generating component, and seals the recess together with the heat generating component; and a heat transfer member that is housed in the recess and the inside surrounded by the packing, is solidified and is in contact with the heat generating component while the heat generating component does not generate heat, and is liquefied following the heat generation of the heat generating component.

5 Claims, 4 Drawing Sheets

(UPPER SIDE)

(LOWER SIDE)

(51) Int. Cl.

| | |
|---|---|
| *B60R 16/023* | (2006.01) |
| *H02G 3/08* | (2006.01) |
| *H02G 3/16* | (2006.01) |
| *H05K 7/20* | (2006.01) |

(52) U.S. Cl.
CPC .............. *H02G 3/088* (2013.01); *H02G 3/16* (2013.01); *H05K 7/203* (2013.01)

(58) Field of Classification Search
CPC ....... H05K 1/0204; H05K 2201/10272; H05K 2201/066; H05K 3/0061; H05K 7/06; H05K 7/20518; H05K 2201/09118; H05K 2201/10409; H05K 1/115; H05K 7/20845; H05K 2201/10416; H05K 2201/10916; H05K 3/0014; H05K 7/2089; H10W 90/00; H01H 45/12; H02B 1/20

See application file for complete search history.

(56) References Cited

U.S. PATENT DOCUMENTS

| | | | | |
|---|---|---|---|---|
| 10,637,224 | B2 | 4/2020 | Hiramitsu et al. | |
| 2005/0221641 | A1* | 10/2005 | Saka ...................... | H05K 7/026 |
| | | | | 439/76.2 |
| 2013/0008683 | A1* | 1/2013 | Xiao ........................ | H02S 40/34 |
| | | | | 174/58 |
| 2013/0012059 | A1* | 1/2013 | Xiao ........................ | H02S 40/34 |
| | | | | 439/535 |
| 2013/0026161 | A1 | 1/2013 | I et al. | |
| 2015/0216088 | A1* | 7/2015 | Kawai ................ | H05K 7/20854 |
| | | | | 361/736 |
| 2018/0079377 | A1* | 3/2018 | Maeda ................ | B60R 16/0238 |
| 2018/0109044 | A1* | 4/2018 | Kawamura ......... | B60R 16/0238 |
| 2018/0326924 | A1* | 11/2018 | Haraguchi .............. | H02G 3/16 |
| 2018/0326930 | A1* | 11/2018 | Fastrez ............... | B60R 16/0207 |
| 2019/0139882 | A1* | 5/2019 | Sato ...................... | H02M 7/003 |
| 2019/0299881 | A1* | 10/2019 | Saito ...................... | H05K 5/062 |
| 2020/0099208 | A1* | 3/2020 | Uchida ................... | H05K 1/02 |
| 2020/0100353 | A1* | 3/2020 | Tanaka ................. | H05K 5/0043 |
| 2022/0408545 | A1* | 12/2022 | Haraguchi ........... | H05K 1/0204 |
| 2023/0247754 | A1* | 8/2023 | Haraguchi ........... | H05K 1/0204 |
| | | | | 174/252 |
| 2024/0057294 | A1* | 2/2024 | Yanagida ................ | H02G 3/16 |
| 2024/0244804 | A1* | 7/2024 | Horiba .............. | H05K 7/20409 |

* cited by examiner (UPPER SIDE)

(LOWER SIDE)

FIG.4

(UPPER SIDE)

(LOWER SIDE)

10

1 (11)

2a

2a

2b

2c 2 (11)

3b

3c 3 (12)

3d

3a

4a 4 (12)

6 (12)

5a

5aa 5 (12)

5b

7

4a 4 (12)

6 (12)

5a

5aa 5 (12)

5b

X

Y

Z

ELECTRICAL JUNCTION BOX AND WIRE HARNESS

CROSS-REFERENCE TO RELATED APPLICATION(S)

The present application claims priority to and incorporates by reference the entire contents of Japanese Patent Application No. 2023-079767 filed in Japan on May 15, 2023.

BACKGROUND OF THE INVENTION

1. Field of the Invention

The present invention relates to an electrical junction box and a wire harness.

2. Description of the Related Art

Conventionally, for example, Japanese Patent Application Laid-open No. 2018-038128 A discloses an electrical junction box including a case having an opening, a liquid coolant stored inside the case, and a bus bar disposed to close the opening of the case and immersed in the liquid coolant. In addition, conventionally, for example, Japanese Patent Application Laid-open No. 2013-031278 A discloses an electrical junction box in which packing is provided on a peripheral edge of a junction box main body.

Here, it is conceivable to use a liquid coolant for cooling the heat generating component and to provide packing for preventing leakage of the liquid coolant. However, in order to appropriately provide cooling performance, there is room for further improvement such as preventing leakage of the liquid coolant due to vibration and suppressing an increase in weight due to the liquid coolant.

SUMMARY OF THE INVENTION

The present invention has been made in view of the above circumstances, and an object of the present invention is to provide an electrical junction box and a wire harness that can appropriately have cooling performance.

In order to achieve the above mentioned object, an electrical junction box according to one aspect of the present invention includes a heat generating component; and a cooling unit configured to cool the heat generating component, wherein the cooling unit includes: a recess provided at a holding position of the heat generating component in a resin case holding the heat generating component; a packing provided along a peripheral edge of the recess, compressed by contact with the heat generating component, and sealing the recess together with the heat generating component; and a heat transfer member housed in the recess and an inside surrounded by the packing, solidified and in contact with the heat generating component while the heat generating component does not generate heat, and liquefied following heat generation of the heat generating component.

In order to achieve the above mentioned object, a wire harness according to another aspect of the present invention includes a wiring member having electrical conductivity; and an electrical junction box electrically connected to the wiring member, wherein the electrical junction box includes a heat generating component, and a cooling unit configured to cool the heat generating component, and the cooling unit includes: a recess provided at a holding position of the heat generating component in a resin case holding the heat generating component; a packing provided along a peripheral edge of the recess, compressed by contact with the heat generating component, and sealing the recess together with the heat generating component; and a heat transfer member housed in the recess and an inside surrounded by the packing, solidified and in contact with the heat generating component while the heat generating component does not generate heat, and liquefied following heat generation of the heat generating component.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

Figure 4:
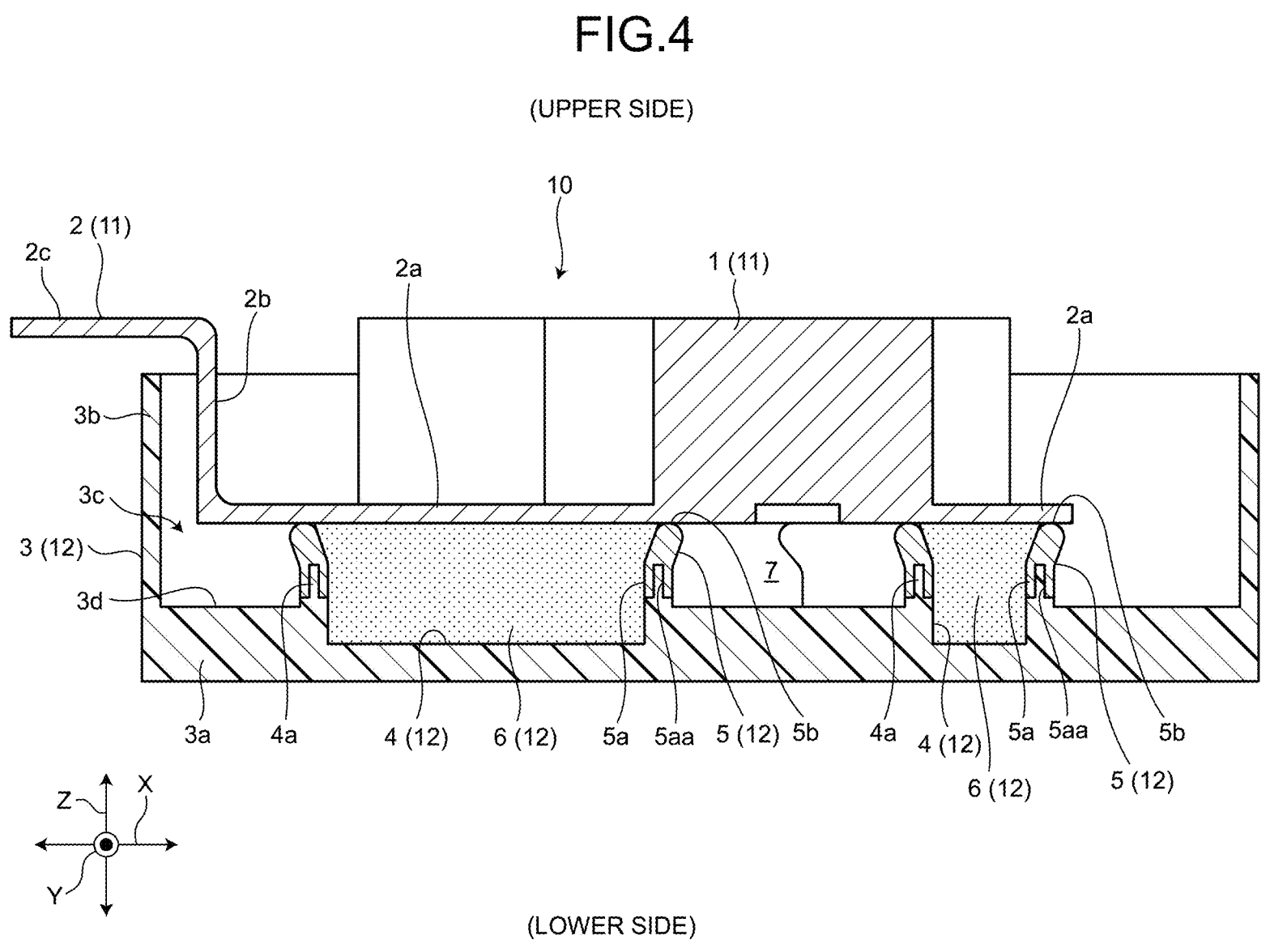

FIG. 4 is a sectional view of the electrical junction box according to the embodiment.

DETAILED DESCRIPTION OF THE PREFERRED EMBODIMENTS

Hereinafter, an embodiment according to the present invention will be described in detail with reference to the drawings. Note that this invention is not limited to the embodiment. Constituent elements in the following embodiment include those that can be easily replaced by a person skilled in the art or those that are substantially the same.

In the following description, three directions intersecting one another are referred to as a "length direction (first direction) X", a "width direction (second direction) Y", and a "height direction (third direction) Z" for convenience. Here, the length direction X, the width direction Y, and the height direction Z are orthogonal to one another. Typically, the length direction X and the width direction Y correspond to a horizontal direction. Typically, the height direction Z corresponds to the vertical direction. A "vertically upper side", "vertically upward", or "vertically above" is referred to as an "upper portion", an "upper side", "upper", "upward", or "above", and a "vertically lower side", "vertically downward", or "vertically below" is referred to as a "lower portion", a "lower side", "lower", "downward", or "below".

Figure 1:
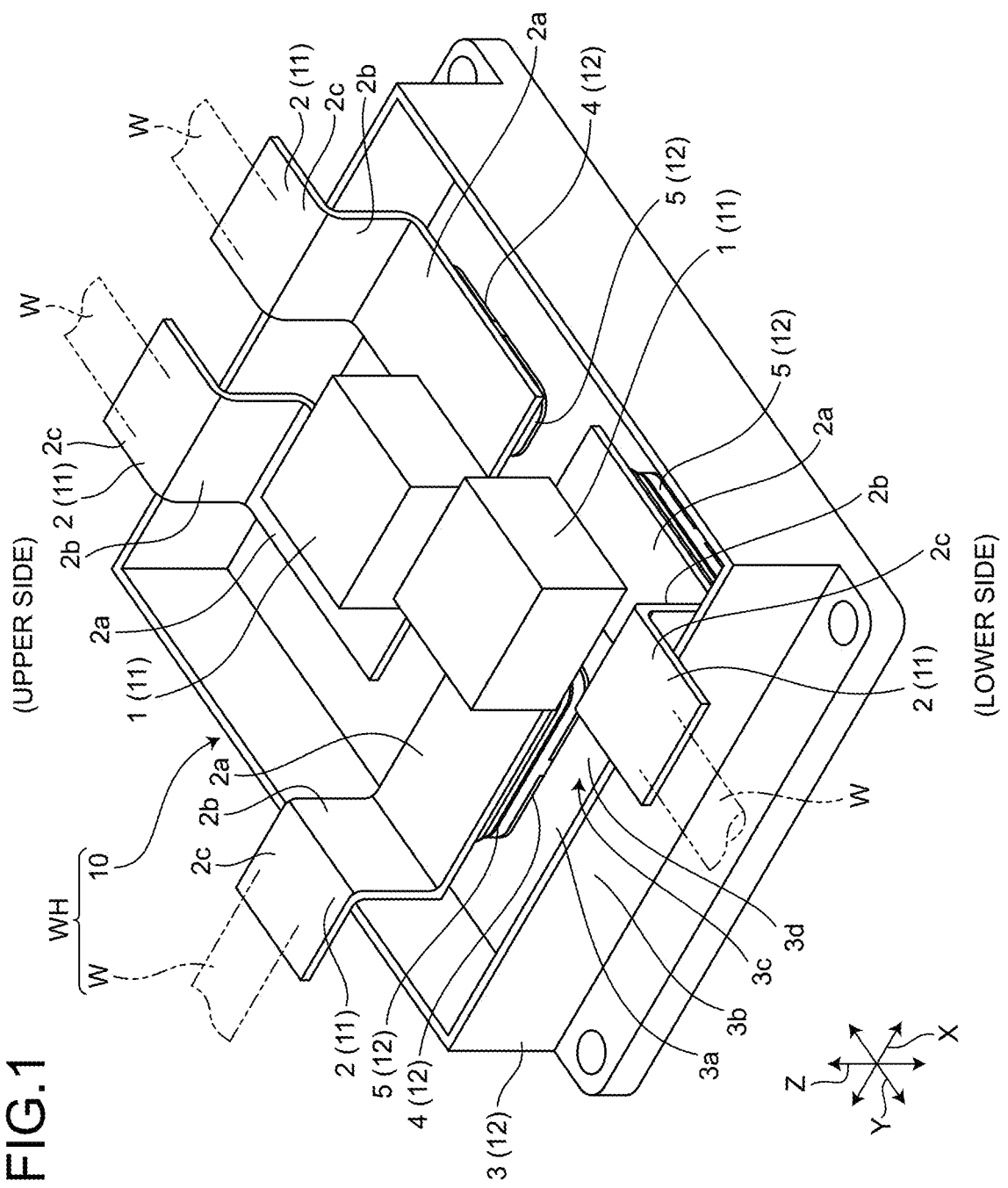
FIG. 1 is a perspective view of an electrical junction box and a wire harness according to an embodiment.
Figure 2:
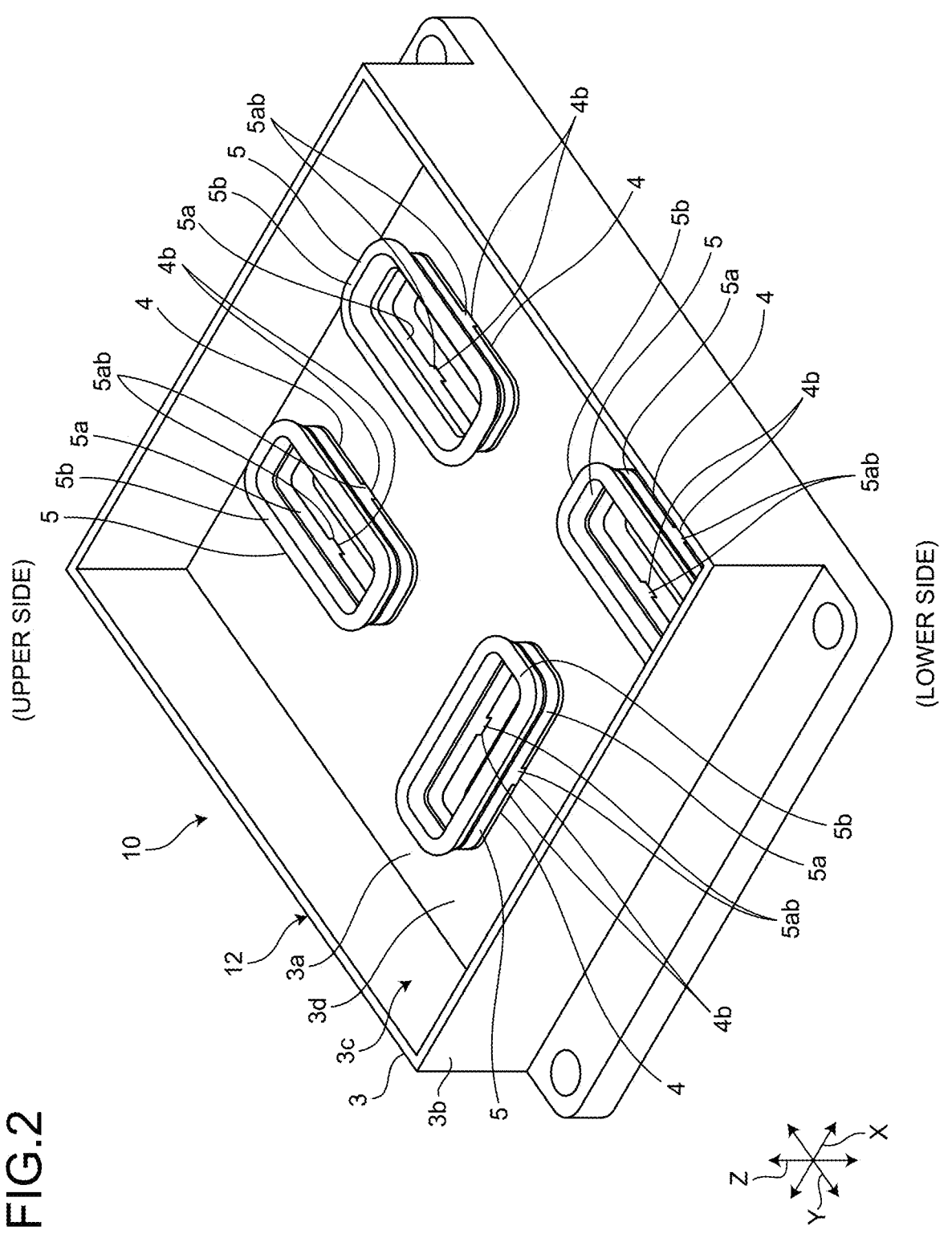
FIG. 2 is a perspective view of the electrical junction box according to the embodiment, excluding heat generating components.
Figure 3:
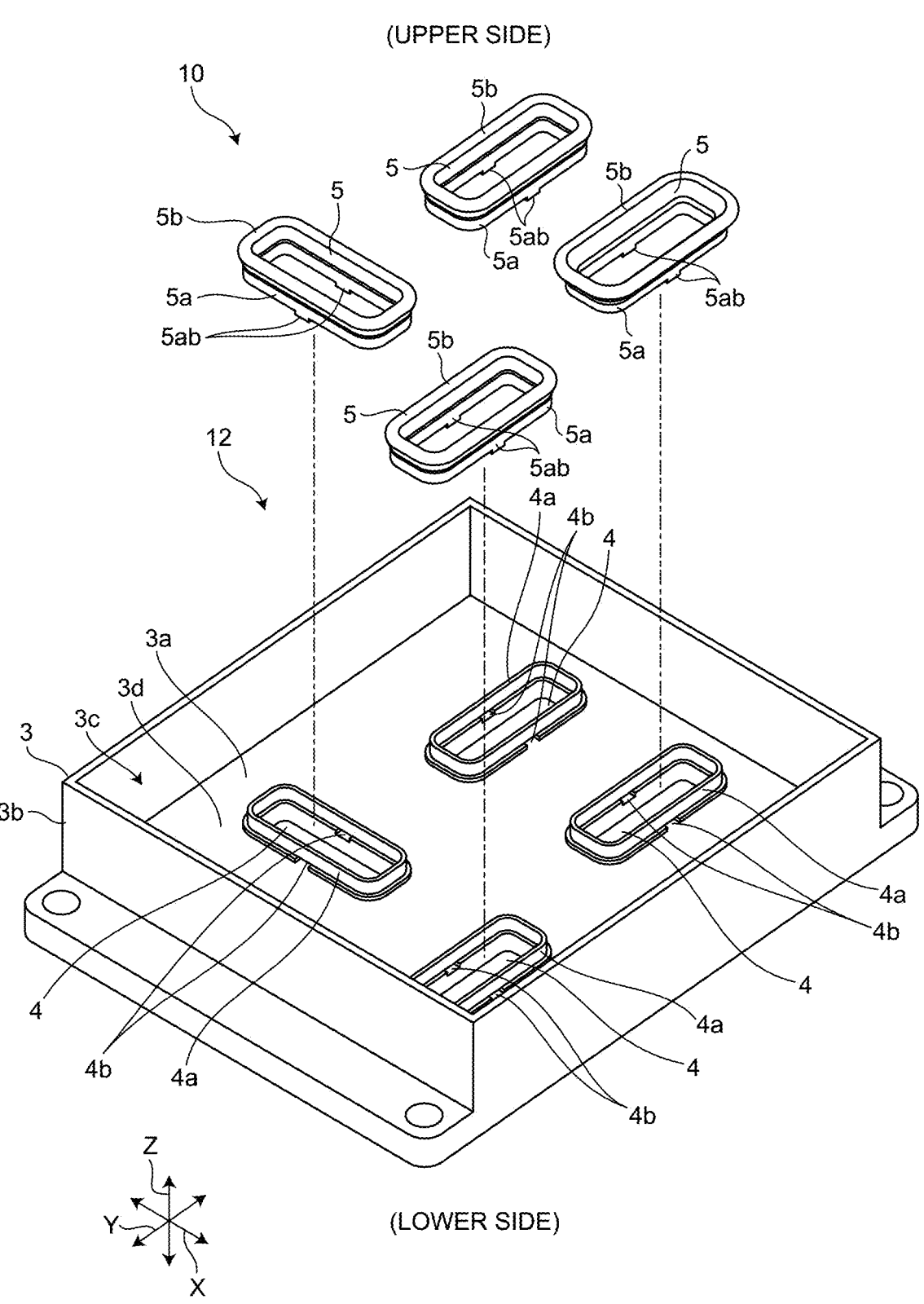
FIG. 3 is an exploded perspective view of the electrical junction box according to the embodiment, excluding heat generating components.

An electrical junction box 10 of the embodiment is mounted on a vehicle such as an automobile and incorporated in a wire harness WH as illustrated in FIG. 1. The wire harness WH is, for example, a member connects a plurality of wiring members W used for power supply and signal communication to devices mounted on a vehicle by a connector or the like to connect the devices to each other. The wire harness WH includes the wiring member W having electrical conductivity and the electrical junction box 10 electrically connected to the wiring member W. The wiring member W is formed of, for example, a metal rod, an electric wire, an electric wire bundle, or the like. The metal rod is formed by covering an outer side of an electrically conductive rod-shaped member with an insulating covering portion.

The electric wire is formed by covering an outer side of a conductor (core wire) including a plurality of electrically conductive metal element wire with an insulating covering portion. The wire harness WH may further include a grommet, a protector, a fastener, and the like.

The electrical junction box 10 collectively houses therein electronic components such as a connector, a fuse, a relay, a capacitor, a branch portion, an electronic control unit, and an electronic component unit obtained by unitizing these components. The electrical junction box 10 is installed, for example, in an engine room of a vehicle or a vehicle cabin. The electrical junction box 10 is connected between a power supply such as a battery and various electronic devices mounted in the vehicle via the wiring member W or the like. The electrical junction box 10 distributes electric power supplied from a power supply to various electronic devices in the vehicle. The electrical junction box 10 may also be referred to as a junction box, a fuse box, a relay box, or the like, but these are collectively referred to as an electrical junction box in the present embodiment. In each drawing, a part of the electrical junction box 10 is taken out and schematically illustrated.

As illustrated in FIGS. 1 to 4, the electrical junction box 10 of the embodiment includes a heat generating component 11 and a cooling unit 12.

The heat generating component 11 is a component that generates heat following energization. In the present embodiment, the heat generating component 11 is a relay 1 and a bus bar 2. The heat generating component 11 may be an electronic component such as a connector, a fuse, a capacitor, a branch portion, an electronic control unit, or an electronic component unit obtained by unitizing these components.

The cooling unit 12 cools the heat generating component 11. The cooling unit 12 includes a resin case 3, a recess 4, packing 5, and a heat transfer member 6.

The resin case 3 holds the heat generating component 11. The resin case 3 is formed of an insulating synthetic resin. The resin case 3 includes a base 3a and a frame 3b.

The base 3a has a thickness in the height direction Z and is formed in a plate shape along the horizontal direction, which is the length direction X and the width direction Y.

The frame 3b includes a plate member extending upward in the height direction Z from the plate face of the base 3a on the upper side, and the plate member constitutes a standing wall surrounding in the length direction X and the width direction Y. In the resin case 3, the base 3a and the frame 3b constitute a housing portion 3c whose upper side is open. Further, in the housing portion 3c of the resin case 3, the plate face of the base 3a on the upper side is configured as a bottom face 3d of the housing portion 3c. The resin case 3 is configured as a lower cover of the electrical junction box 10. Although not clearly illustrated in the drawing, the opening on the upper side of the housing portion 3c of the resin case 3 is closed by an upper cover.

The housing portion 3c of the resin case 3 holds the heat generating component 11. As described above, the heat generating component 11 of the embodiment is the relay 1 and the bus bar 2. In the heat generating component 11, a pair of bus bars 2 is provided below the relay 1. That is, in the heat generating component 11, two bus bars 2 are connected to the relay 1. The bus bar 2 is formed in a plate shape, is connected to the relay 1, and includes a flat portion 2a, a rising portion 2b, and a connection portion 2c. The flat portion 2a is a portion in which the plate face thereof is disposed along the bottom face 3d of the housing portion 3c. The rising portion 2b is a portion that is bent upward from the flat portion 2a and in which the plate face thereof is disposed along the frame 3b. The connection portion 2c is a portion that is bent along the horizontal direction from the rising portion 2b and extends to the outside of the housing portion 3c (the frame 3b), and is a portion to which the wiring member W is connected. In the electrical junction box 10, a plurality of (two in the embodiment) heat generating components 11 (the relay 1 and the two bus bars 2) are disposed in the housing portion 3c.

The recess 4 is formed to be open at the bottom face 3d of the housing portion 3c of the resin case 3. The recess 4 is formed to be recessed below the bottom face 3d. The recess 4 protrudes upward from the bottom face 3d, and a loop-shaped protrusion 4a surrounding the upper opening of the recess 4 is formed. The recess 4 includes cutouts 4b formed inside and outside the loop-shaped protrusion 4a. A pair of the cutouts 4b are formed at positions opposite to each other inside and outside the loop-shaped protrusion 4a, and the pair is formed at a plurality of positions (two positions in the second embodiment). The recess 4 is disposed below plate faces of the two bus bars 2 in the heat generating component 11 held by the resin case 3. In the embodiment, a plurality of heat generating components 11 are disposed in the housing portion 3c. Therefore, at the housing portion 3c, a plurality of recesses 4 are provided at intervals corresponding to the plurality of individual heat generating components 11 (bus bars 2).

The packing 5 is formed in a loop shape by an elastic material such as rubber. The packing 5 is provided along the peripheral edge of the recess 4 inside the housing portion 3c. In the packing 5, one end side of an annular shape is configured as a proximal end 5a, and the other end side is configured as a distal end 5b. At the proximal end 5a of the packing 5, a loop-shaped groove 5aa into which the loop-shaped protrusion 4a of the recess 4 is press-fitted is formed (see FIG. 4). The packing 5 includes a fitting protrusion 5ab that is to be fitted into the cutout 4b of the recess 4 and is formed at the proximal end 5a. The packing 5 is fixed so as to surround the peripheral edge of the recess 4 by press-fitting the loop-shaped protrusion 4a into the loop-shaped groove 5aa and fitting the fitting protrusion 5ab into the cutout 4b. The packing 5 is formed in a tapered shape such that the diameter of the packing 5 gradually expands in the direction toward the outer circumference from the proximal end 5a toward the distal end 5b. Therefore, the packing 5 is disposed such that the distal end 5b is away from the bottom face 3d of the housing portion 3c, serving as the opening of the recess 4, while the packing 5 is fixed surrounding the peripheral edge of the recess 4, and the diameter of the loop shape gradually expands in the direction toward the outer circumference from the proximal end 5a side toward the distal end 5b side, i.e., upward in the height direction Z.

As described above, in the packing 5 fixed to the peripheral edge of the recess 4, the distal end 5b comes into contact with the plate face on the lower side of each bus bar 2 of the heat generating component 11 disposed inside the housing portion 3c. In the heat generating component 11, the bus bar 2 is located at the lowermost position, and the plate face of the bus bar 2 on the lower side is located at the lowermost position. On the other hand, the packing 5 fixed to the peripheral edge of the recess 4 is disposed such that the distal end 5b is away from the bottom face 3d of the housing portion 3c at which the recess 4 is open. Therefore, the packing 5 is compressed downward toward the bottom face 3d by the heat generating component 11, and the heat generating component 11 is disposed with a gap 7 intervening between the bottom face 3d and the heat generating component 11 so as to be away upward from the bottom face 3*d* of the housing portion 3*c* by the packing 5. The packing 5 seals the opening of the recess 4 together with the heat generating component 11. The packing 5 is provided such that the diameter of the loop shape of the distal end 5*b* in contact with the heat generating component 11 expands in the direction toward the outer circumference. The plurality of recesses 4 are provided at intervals in the housing portion 3*c*, and thus, likewise, a plurality of pieces of the packing 5 are provided at intervals in the housing portion 3*c* corresponding to the plurality of individual heat generating components 11 (bus bars 2).

The heat transfer member 6 is formed of, for example, paraffin. The paraffin forming the heat transfer member 6 has a melting point of 50 degrees Celsius to 75 degrees Celsius and is in a solidified state at a temperature equal to or lower than the melting point. The heat transfer member 6 is solidified at the time of assembling the electrical junction box 10. The heat transfer member 6 is housed in the recess 4 and the inside surrounded by the packing 5 in a form in which the packing 5 is compressed by the heat generating component 11. The heat transfer member 6 is in contact with the heat generating component 11 (the plate face of the bus bar 2 on the lower side). The heat transfer member 6 is solidified while the heat generating component 11 is not energized and no heat is generated (also referred to "in a regular condition"), whereas the heat transfer member 6 is liquefied following the heat generation of the heat generating component 11 while the heat generating component 11 is energized and heat is generated. The liquefied heat transfer member 6 transfers heat of the heat generating component 11 to the resin case 3 to cool the heat generating component 11. The liquefied heat transfer member 6 is prevented from being leaked by the packing 5 that seals the opening of the recess 4 together with the heat generating component 11. The plurality of recesses 4 are provided at intervals in the housing portion 3*c*, and thus, likewise, a plurality of the heat transfer members 6 are provided at intervals corresponding to the plurality of individual heat generating components 11 (bus bars 2).

As described above, the electrical junction box 10 of the embodiment includes the heat generating component 11 and the cooling unit 12 that cools the heat generating component 11. The cooling unit 12 includes: the recess 4 provided at the holding position of the heat generating component 11 in the resin case 3 that holds the heat generating component 11; the packing 5 that is provided along the peripheral edge of the recess 4, is compressed by the contact with the heat generating component 11, and seals the recess 4 together with the heat generating component 11; and the heat transfer member 6 that is housed in the recess 4 and the inside surrounded by the packing 5, is solidified and is in contact with the heat generating component 11 while the heat generating component 11 does not generate heat, and is liquefied following the heat generation of the heat generating component 11.

The wire harness WH of the embodiment includes the wiring member W having electrical conductivity and the electrical junction box 10 electrically connected to the wiring member W. The electrical junction box 10 includes the heat generating component 11 and the cooling unit 12 that cools the heat generating component 11. The cooling unit 12 includes: the recess 4 provided at the holding position of the heat generating component 11 in the resin case 3 that holds the heat generating component 11; the packing 5 that is provided along the peripheral edge of the recess 4, is compressed by the contact with the heat generating component 11, and seals the recess 4 together with the heat generating component 11; and the heat transfer member 6 that is housed in the recess 4 and the inside surrounded by the packing 5, is solidified and is in contact with the heat generating component 11 while the heat generating component 11 does not generate heat, and is liquefied following the heat generation of the heat generating component 11.

According to the electrical junction box 10 and the wire harness WH, the heat generated by the heat generating component 11 is transferred to the heat transfer member 6 to liquefy the heat transfer member 6. Further, the heat is transferred to the resin case 3 including the recess 4 in which the heat transfer member 6 is housed, and the heat generating component 11 is cooled. The packing 5 elastically deforms and follows the heat generating component 11 so as to maintain contact with the heat generating component 11 during vibration, so that leakage of the liquefied heat transfer member 6 can be prevented. Therefore, the electrical junction box 10 and the wire harness WH of the embodiment can appropriately have cooling performance by moderating the temperature rise of the heat generating component 11 by the liquefied heat transfer member 6 and preventing leakage of the liquefied heat transfer member 6. The electrical junction box 10 and the wire harness WH of the embodiment as described above can have cooling performance and thus are suitably used for rapid charging in which the temperature of generated heat is relatively high. The heat transfer member 6 solidifies and comes into contact with the heat generating component 11 while the heat generating component 11 does not generate heat, so that the efficiency of transferring heat to the heat transfer member 6 can be improved by the contact while the heat generating component 11 generates heat, and cooling performance can be improved.

In the electrical junction box 10 and the wire harness WH of the embodiment, the packing 5 is formed such that a portion in contact with the heat generating component 11 (the distal end 5*b*) expands in the direction toward the outer circumference.

According to the electrical junction box 10 and the wire harness WH, larger contact area of the heat transfer member 6 to be housed can be reserved at the portion in contact with the heat generating component 11, and the efficiency of transferring heat to the heat transfer member 6 can be improved.

In the electrical junction box 10 and the wire harness WH of the embodiment, the plurality of heat transfer members 6, the plurality of recesses 4, and the plurality of pieces of packing 5 are respectively provided at intervals corresponding to the plurality of individual heat generating components 11 in the resin case 3.

According to the electrical junction box 10 and the wire harness WH, the volume of the heat transfer member 6 can be reduced as compared with the case in which the heat transfer members 6, the recesses 4, and the pieces of packing 5 are disposed corresponding to all the plurality of heat generating components 11. Thus, reduction in size and weight can be achieved.

Note that the above-described electrical junction box 10 and wire harness WH according to the embodiment of the present invention is not limited to the above-described embodiment, and various modifications can be made within the scope recited in the claims. The electrical junction box 10 and wire harness WH according to the present embodiment may be configured by appropriately combining the constituent elements of the embodiment and the modifications described above.

The electrical junction box and the wire harness according to the present embodiment can appropriately have cooling performance.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical junction box comprising:

a heat generating component; and a cooling unit configured to cool the heat generating component, wherein the cooling unit includes: a recess provided at a holding position of the heat generating component in a resin case holding the heat generating component; a packing provided along a peripheral edge of the recess, compressed by contact with the heat generating component, and sealing the recess together with the heat generating component; and a heat transfer member housed in the recess and an inside surrounded by the packing, solidified and in contact with the heat generating component while the heat generating component does not generate heat, and liquefied following heat generation of the heat generating component.

2. The electrical junction box according to claim 1, wherein the packing includes a portion in contact with the heat generating component, the portion spreading in a direction toward an outer circumference.

3. The electrical junction box according to claim 1, wherein a plurality of the heat transfer members, the recesses, and the packing are provided at intervals, respectively corresponding to a plurality of the heat generating components in the resin case.

4. The electrical junction box according to claim 2, wherein a plurality of the heat transfer members, the recesses, and the packing are provided at intervals, respectively corresponding to a plurality of the heat generating components in the resin case.

5. A wire harness comprising:

a wiring member having electrical conductivity; and an electrical junction box electrically connected to the wiring member, wherein the electrical junction box includes a heat generating component, and a cooling unit configured to cool the heat generating component, and the cooling unit includes: a recess provided at a holding position of the heat generating component in a resin case holding the heat generating component; a packing provided along a peripheral edge of the recess, compressed by contact with the heat generating component, and sealing the recess together with the heat generating component; and a heat transfer member housed in the recess and an inside surrounded by the packing, solidified and in contact with the heat generating component while the heat generating component does not generate heat, and liquefied following heat generation of the heat generating component.

* * * * *